United States Patent
Yoon et al.

(10) Patent No.: US 7,970,209 B2
(45) Date of Patent: *Jun. 28, 2011

(54) HOLOGRAPHIC DATA STORAGE USING OVERSAMPLING AND BALANCED CODEWORDS

(75) Inventors: Pil-Sang Yoon, Suwon-si (KR); Hak-Sun Kim, Gunpo-si (KR); Eui-Seok Hwang, Seoul (KR)

(73) Assignee: Daewoo Electronics Corp., Seoul (KR)

( * ) Notice: Subject to any disclaimer, the term of this patent is extended or adjusted under 35 U.S.C. 154(b) by 1181 days.

This patent is subject to a terminal disclaimer.

(21) Appl. No.: 11/486,434

(22) Filed: Jul. 13, 2006

(65) Prior Publication Data

US 2007/0206485 A1 Sep. 6, 2007

(30) Foreign Application Priority Data

Mar. 3, 2006 (KR) .................. 10-2006-0020465

(51) Int. Cl.
*G06K 9/00* (2006.01)
*G11C 13/04* (2006.01)
*G11C 7/00* (2006.01)
*G11B 7/00* (2006.01)

(52) U.S. Cl. ........ 382/181; 382/210; 382/312; 365/125; 365/216; 365/235; 369/103

(58) Field of Classification Search .................. 382/181, 382/210, 299, 312; 369/103, 53.35; 365/125, 365/216, 235

See application file for complete search history.

(56) References Cited

U.S. PATENT DOCUMENTS

| 4,326,219 A | 4/1982 | Griesshaber |
| 5,511,058 A | 4/1996 | Visel et al. |
| 5,694,488 A | 12/1997 | Hartmann |
| 6,005,693 A * | 12/1999 | Burr .............................. 359/21 |
| 6,016,330 A * | 1/2000 | Ashley et al. ................. 375/341 |

(Continued)

FOREIGN PATENT DOCUMENTS

EP 0 817 201 1/1998

(Continued)

OTHER PUBLICATIONS

Burr et al. (Apr. 2001) "Compensation for pixel misregistration in volume holographic data storage." Optics Letters, vol. 26 No. 8, pp. 542-544.*

(Continued)

*Primary Examiner* — Brian P Werner
*Assistant Examiner* — Barry Drennan
(74) *Attorney, Agent, or Firm* — Revolution IP, PLLC

(57) ABSTRACT

There is provided an optical information detecting method. The method includes: detecting an image of a source data page coded with balanced codewords by the use of 1:N (where N is greater than 1) excessive detection pixels; determining a distribution pattern of valid detection pixels and invalid detection pixels to be corrected in the detected image by the use of a light intensity distribution of the detected image; and dividing the detected image into balanced codeword detecting areas corresponding to the balanced codewords and sampling data of the balanced codeword detecting areas by the use of the determined distribution pattern and an optical distribution characteristic of the balanced codewords. Accordingly, it is possible to efficiently detect optical information by the use of a 1:N over-sampling method. Specifically, the distribution pattern of valid detection pixels and invalid detection pixels in the detected image of a data page can be properly used to sample a balanced code.

18 Claims, 11 Drawing Sheets

U.S. PATENT DOCUMENTS

| | | | |
|---|---|---|---|
| 6,665,454 B1 | 12/2003 | Silverbrook et al. | |
| 6,954,554 B2* | 10/2005 | Roh | 382/232 |
| 7,519,224 B2* | 4/2009 | Kang | 382/210 |
| 2003/0168317 A1* | 9/2003 | Fromme et al. | 198/502.1 |
| 2004/0252212 A1* | 12/2004 | Ohkawa | 348/308 |
| 2005/0018263 A1* | 1/2005 | Pharris | 359/22 |
| 2005/0196068 A1* | 9/2005 | Kawai | 382/276 |
| 2005/0286388 A1* | 12/2005 | Ayres et al. | 369/103 |

FOREIGN PATENT DOCUMENTS

| | | |
|---|---|---|
| EP | 1 531 463 | 5/2005 |
| EP | 1 801 793 | 6/2007 |
| JP | 10-097792 | 4/1998 |
| KR | 1020050059667 | 6/2005 |
| KR | 1020050116013 | 8/2005 |
| KR | 10-2005-0090222 | 9/2005 |
| TW | I1248073 | 1/2006 |

OTHER PUBLICATIONS

Ayres et al. (Apr. 2006) "Image oversampling for page-oriented optical data storage." Applied Optics, vol. 45 No. 11, pp. 2459-2464.*

Yoon et al. (Oct. 2004) "Image compensation for sub-pixel misalignment in holographic data storage." Proc. Int'l Symp. on Optical Memory 2004.*

Hwang et al. (Mar. 2002) "A new efficient error correctible modulation code for holographic data." Jpn. J. Applied Physics, vol. 41 No. 3B, pp. 1763-1766.*

Hwang et al. (Feb. 2006) "Channel data retrieval in page-based holographic data storage." Jpn. J. Applied Physics, vol. 45 No. 2B, pp. 1285-1287.*

Suto et al. (Dec. 2004) "Optimisation of data density in Fourier holographic system using spatial filtering and sparse modulation coding." Optik vol. 115 No. 12, pp. 541-546.*

Pratt, W.K. (Dec. 2001) "Digital Image Processing: PIKS Inside." $3^{rd}$ Ed., John Wiley & Sons, pp. 243-248.*

A new balanced modulation code for a phase-image-based holographic data storage system, Renu John Joby Joseph and Kehar Singh, May 10, 2005.

Modulation coding for pixel-matched holographic data storage, Geoffrey W. Burr, Jonathan Ashley, Hans Coufal, Robert K Grygier, et al. Oct. 24, 1996.

European Search Report for Application No. 06014925.9, mailed Aug. 13, 2007.

* cited by examiner

HOLOGRAPHIC DATA STORAGE USING OVERSAMPLING AND BALANCED CODEWORDS

BACKGROUND

1. Technical Field

The present invention relates to an optical information detecting method, an optical information detector, and a data sampling method, and more particularly, to an optical information detecting method, an optical information detector, a data sampling method, in which optical information can be efficiently detected from an optical information recording medium.

2. Related Art

Recently, with increase in requirement for a next-generation storage system having large storage capacity, an optical information processing system using holography, that is, a holographic optical information processing system, has attracted attention.

In the holographic optical information processing system, by irradiating a signal beam containing data and a reference beam at an angle different from that of the signal beam to a predetermined position of an optical information recording medium and intersecting two beams each other, an interference pattern is recorded in the optical information recording medium. At the time of reproducing the stored information, using diffracted beam generated from the interference pattern by irradiating the reference beam to the stored interference pattern, original data are reproduced.

In the holographic optical information processing system, data can be superposed and stored at the same position of the optical information recording medium by the use of a variety of multiplexing methods and the superposed and stored data can be separated and reproduced. Accordingly, it is possible to embody a data storage system with a super large capacity. Examples of the multiplexing methods can include an angular multiplexing method, a wavelength multiplexing method, and a phase code multiplexing method.

On the other hand, in the holographic optical information processing system, digital data are processed in units of predetermined pages and a page which is unit data is called a data page. That is, the holographic optical information processing system processes data in units of data pages. The optical information processing operation in units of data pages is described in detail in U.S. Pat. No. 5,838,650 and Japanese Unexamined Patent Publication No. 1998-97792.

For example, in the holographic optical information processing system, input data are encoded in units of data pages, the encoded binary data are allowed to correspond to pixels to create two-dimensional images of data pages, the two-dimensional images of data pages are loaded to a signal beam, and the signal beam is irradiated to the optical information medium. This optical modulation is carried out by a spatial light modulator (SLM).

At this time, a reference beam is irradiated to the optical information recording medium at an angle different from the irradiation angle of the signal beam. The signal beam and the reference beam interfere with each other in the optical information recording medium and the images of the data pages loaded to the signal beams are recorded in the form of interference patterns in the optical information recording medium.

The images of the data pages recorded in the optical information recording medium can be reproduced by irradiating the reference beam to the interference patterns. The reproduced images of the data pages can be detected by a light receiving device such as a complementary metal-oxide semiconductor (CMOS) or a charge coupled device (CCD). The detected images of the data pages are reproduced in original data through predetermined signal processing and decoding operations.

On the other hand, a variety of sampling methods as follows can be used for detecting the images of the data pages by the use of the light receiving device.

1. 1:1 Pixel Matching Method

A 1:1 pixel matching method is a method of matching pixels of the light receiving device (hereinafter, referred to as "light receiving pixels") with pixels of the reproduced image of the data page (hereinafter, referred to as "data pixels") in 1:1. In the 1:1 pixel matching method, since one data pixel corresponds to one light receiving pixel, the storage density is high at the time of detecting the image.

At the time of actually reproducing the image of the data page, the position of the reproduced image formed on the light receiving device varies due to shrinkage or rotation of the optical information recording medium, and misalignment is caused. Accordingly, the data pixels and the detection pixels are not matched with each other.

However, in the 1:1 pixel matching method, when two kinds of pixels depart from each other by a half or more size of the data pixel, the image of the data page detected by the light receiving device can be severely degraded. When the departure of pixels is severe, it is not possible to obtain accurate information.

2. 1:3 Over-Sampling Method

A 1:3 over-sampling method is a method of detecting one data pixel by the use of 9 detection pixels (3×3). In the 1:3 over-sampling method, even when the departure between the data pixels and the detection pixels occurs, the detection pixel positioned at the center of the 9 detection pixels can detect the beam from the data pixel. Accordingly, everywhere the reproduced image of the data page is located in the light receiving device, it is possible to obtain data with high reliability from the image detected by the center detection pixel.

However, in the 1:3 over-sampling method, since 9 detection pixels are required for detecting one data pixel at the time of detecting the image, the storage density is too low. For example, when a light receiving device having 1200×1200 detection pixels is used, one data page can contain 400×400 pixels of data. Accordingly, stability of a system can be secured, but the storage capacity which is the best advantage of a holographic memory is degraded.

3. 1:2 Over-Sampling Method

A 1:2 over-sampling method is a method of detecting one data pixel by the use of 4 detection pixels (2×2). In the 1:2 over-sampling method, similarly to the 1:3 over-sampling method, even when a departure occurs between the data pixels and the detection pixels, one detection pixel of the 4 detection pixels can detect the beam from the data pixel. Accordingly, it is possible to obtain data with high reliability. However, in comparison with the pixel matching method, the 1:2 over-sampling method has a disadvantage that the storage density is 25% of that of the pixel matching method.

The known pixel matching method has an advantage of a large storage density but has a disadvantage of misalignment between pixels. The known 1:3 over-sampling method and 1:2 over-sampling method have an advantage of high reliability in detecting data but have a disadvantage of too small storage density. Therefore, an optical information detecting method capable of securing reliability in data detection and satisfying a high storage density has been required.

SUMMARY

The present invention is contrived to solve the above-mentioned problems. An object of the invention is to provide an optical information detecting method which can efficiently detect optical information stored in an optical information recording medium by using a 1:N over-sampling method (where N is greater than 1) and a balanced code.

Another object of the invention is to provide an optical information detector which can efficiently detect optical information stored in an optical information recording medium by using a 1:N over-sampling method (where N is greater than 1).

Another object of the invention is to provide a data sampling method which can efficiently sample optical information at the time of performing a 1:N over-sampling method (where N is greater than 1).

According to an aspect of the invention, there is provided an optical information detecting method. The method includes: detecting an image of a source data page coded with balanced codewords by the use of 1:N (where N is greater than 1) excessive detection pixels; determining a distribution pattern of valid detection pixels and invalid detection pixels to be corrected in the detected image by the use of a light intensity distribution of the detected image; and dividing the detected image into balanced codeword detecting areas corresponding to the balanced codewords and sampling data of the balanced codeword detecting areas by the use of the determined distribution pattern and a unique optical distribution characteristic of the balanced codewords.

According to another aspect of the invention, there is provided an optical information detector comprising: an optical detection unit detecting an image of a source data page coded with balanced codewords by the use of 1:N (where N is greater than 1) excessive detection pixels; and an optical information processor determining a distribution pattern of valid detection pixels and invalid detection pixels in the detected image by the use of a light intensity distribution of the detected image, dividing the detected image into balanced codeword detecting areas corresponding to the balanced codewords, and sampling data of the balanced codeword detecting areas by the use of the determined distribution pattern and a unique optical distribution characteristic of the balanced codewords.

According to another aspect of the invention, there is provided a data sampling method of sampling data from a detected image of a data page which is coded with balanced codewords and is detected by the use of 1:N (where N is greater than 1) excessive detection pixels, the data sampling method comprising: calculating a light intensity distribution of the detected image to detect a frame mark detecting area corresponding to a frame mark of the data page and determining a distribution pattern of valid detection pixels and invalid detection pixels by the use of a unique optical distribution of the detected frame mark detecting area; and dividing the detected image into balanced codeword detecting areas corresponding to the balanced codewords and sampling data of the balanced codeword detecting areas by the use of the determined distribution pattern and a unique optical distribution characteristic of the balanced codeword.

According to another aspect of the invention, there is provided a data sampling method of sampling data from a detected image of a data page which is coded with balanced codewords and is detected by the use of 1:N (where N is greater than 1) excessive detection pixels, the data sampling method comprising: dividing the detected image into balanced codeword detecting areas corresponding to the balanced codewords and classifying the detection pixels in the balanced codeword detecting areas into valid detection pixels and invalid detection pixels on the basis of the light intensity distribution of the detected image; determining the optical information of the valid detection pixels by the use of the unique optical distribution characteristic of the balanced codewords to detect data of data pixel detected by the valid detection pixels; and calculating the values of the data pixels and the optical information of the invalid detection pixels to detect data of data pixels detected by the invalid detection pixels.

BRIEF DESCRIPTION OF THE DRAWINGS

The above and other features and advantages of the present invention will become more apparent by describing in detail exemplary embodiments thereof with reference to the attached drawings in which.

DESCRIPTION OF EXEMPLARY EMBODIMENTS

Hereinafter, exemplary embodiments of the present invention will be described in detail with reference to the attached drawings.

Figure 1:
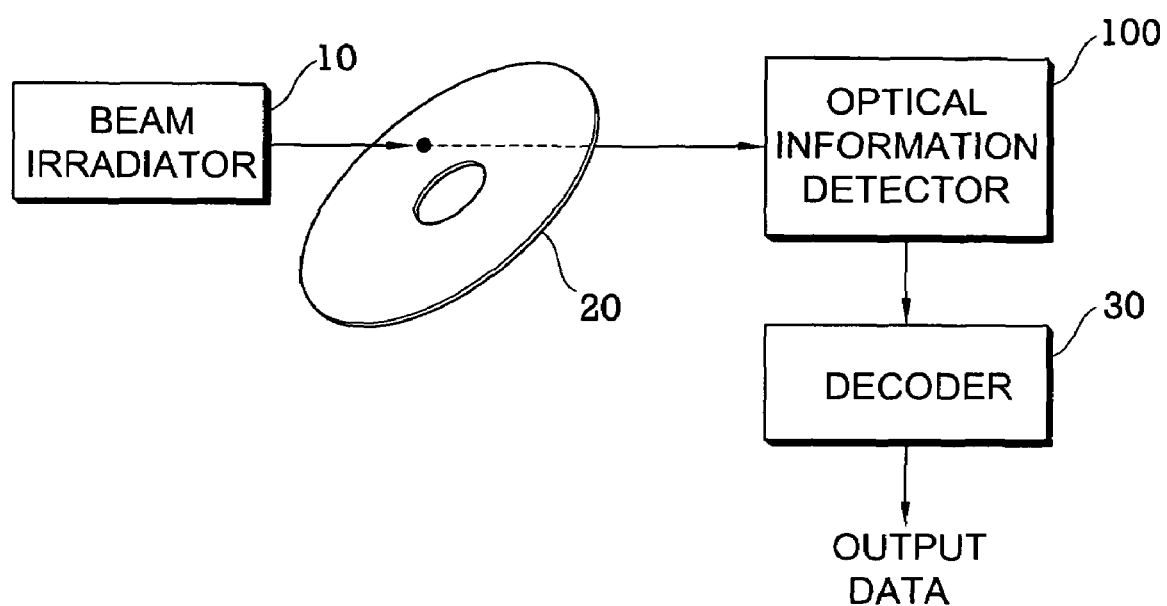
FIG. 1 is a block diagram illustrating a configuration of an optical information reproducing apparatus having an optical information detector according to an exemplary embodiment of the invention.

FIG. 1 is a block diagram illustrating a configuration of an optical information reproducing apparatus having an optical information detector according to an exemplary embodiment of the invention.

Referring to FIG. 1, the optical information reproducing apparatus includes a beam irradiator 10 generating a beam such as a laser beam and irradiating the beam to an optical information recording medium 20. The beam irradiated from the beam irradiator 10 is incident on the optical information recording medium 20 at a predetermined angle. A plurality of data pages is stored in the form of interference patterns in the optical information recording medium 20. The interference pattern may be a holographic interference pattern. The beam irradiated from the beam irradiator 10 may be one of a reference beam for reproducing the holographic interference pattern stored in the optical information recording medium 20 and a phase-conjugation reference beam.

When the beam is incident on an interference pattern stored in the optical information recording medium 20, an image of a data page is reproduced by diffraction of the interference pattern. The reproduced image of the data page is detected by an optical information detector 100. The detected image of the data page is output as binary data through correction and sampling operations. The binary data are decoded to original data by a decoder 30.

Figure 2:
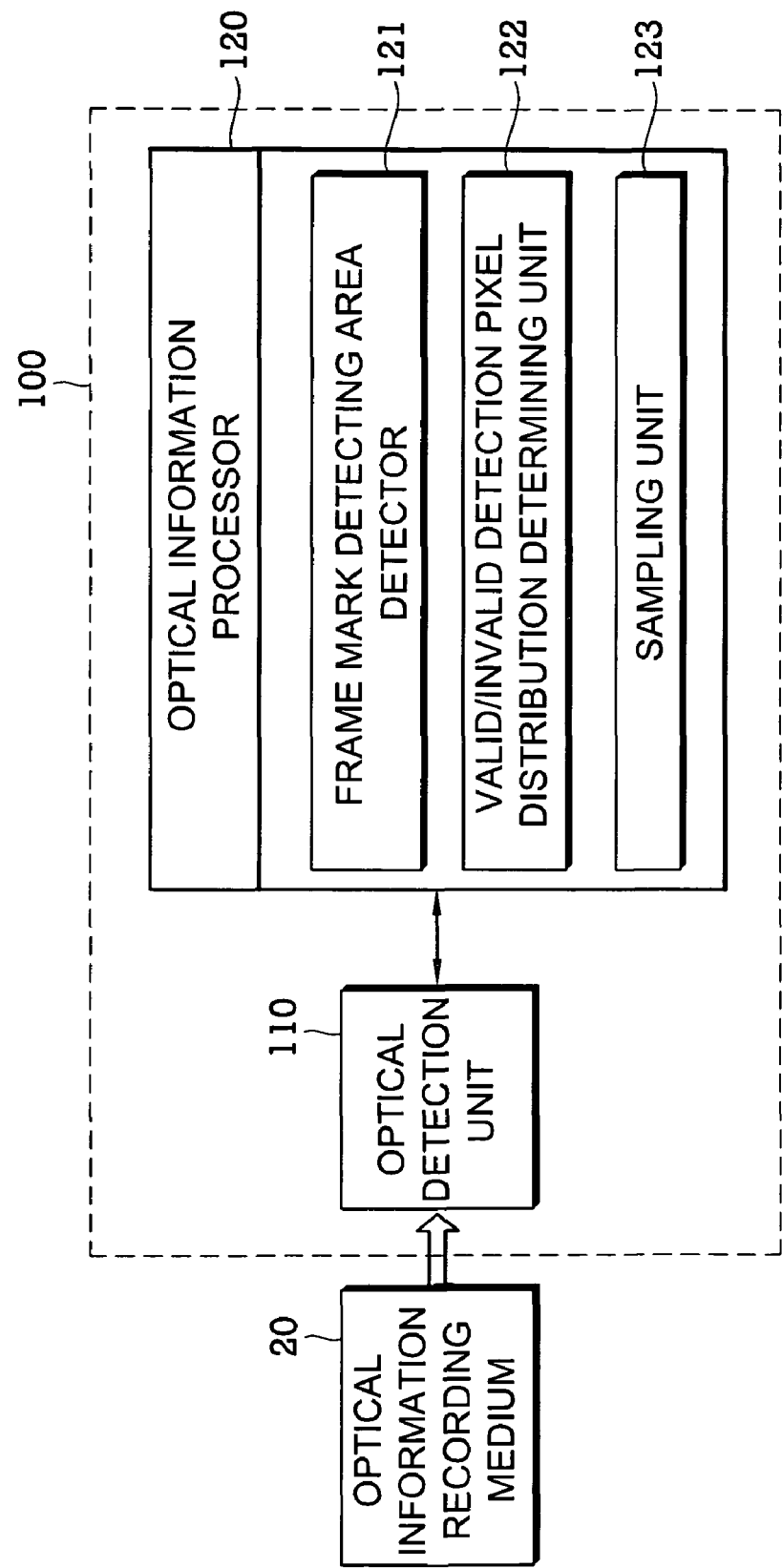
FIG. 2 is a block diagram illustrating a configuration of the optical information detector shown in FIG. 1.

FIG. 2 is a block diagram illustrating a configuration of the optical information detector 100 shown in FIG. 1.

Referring to FIG. 2, the optical information detector 100 according to an exemplary embodiment of the invention includes an optical detection unit 110 detecting an image of a data page which is encoded with balanced codewords by the use of 1:N (where N is greater than 1) excessive detection pixels.

Here, the 1:N excessive detection pixel means that an optical system is constructed so that one data pixel of the source data page corresponds to N×N detection pixels. That is, data are detected through a 1:N over-sampling operation.

For examples, in case of 1:1.5 excessive detection pixels in which N is 1.5, one data pixel corresponds to 1.5×1.5 detection pixels and thus 2×2 data pixels are mapped onto 3×3 detection pixels. In case of 1:1.33 excessive detection pixels in which N is 1.33, one data pixel corresponds to 1.33 detection pixels and thus 3×3 data pixels are mapped onto 4×4 detection pixels.

Preferably, in the optical detection unit 110, the 1:N excessive detection pixels are arranged, that is, the detection pixels are arranged at a ratio of N×N detection pixels per 1×1 data pixel of the image of a data page. The detection pixels detect images of the data pixels by the use of optical detection regions having a horizontal width or a vertical width smaller than that of each detection pixel.

Figure 3:
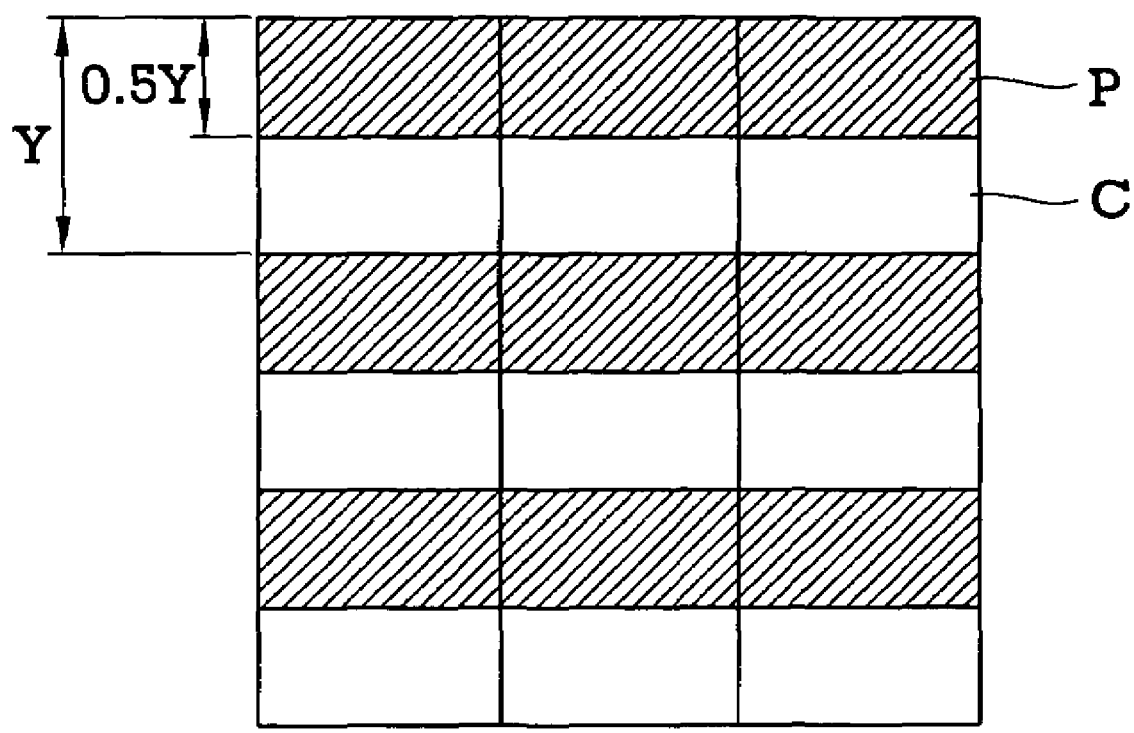
FIG. 3 is a plan view illustrating an arrangement structure of detection pixels in an optical detection unit shown in FIG. 2.

FIG. 3 is a plan view illustrating an arrangement structure of detection pixels of the optical detection unit 110. Grids shown in FIG. 3 denote the detection pixels C, and hatched portions in the detection pixels C denote optical detection regions P for actually detecting an image.

Referring to FIG. 3, each detection pixel C includes an optical detection region P having a vertical width smaller than the vertical width of the corresponding detection pixel C.

For example, the vertical width of the optical detection region P can be a half of the vertical width of the detection pixel C. That is, when it is assumed that the vertical width of the detection pixel C is Y, the vertical width of the optical detection region P is expressed by 0.5 Y. On the other hand, the horizontal width of the optical detection region may be a half the horizontal width of the optical detection pixel, depending upon environments.

The optical detection region P can be disposed at a variety of positions in the detection pixel P. In FIG. 3, each optical detection region P is disposed at the upper portion of the corresponding detection pixel C. However, the optical detection region P may be positioned at the center or at the lower portion of the detection pixel C. Preferably, the optical detection regions P are disposed at the same position in the respective detection pixels C.

The detection pixels C may be complementary metal-oxide semiconductor (CMOS) pixels or charge-coupled device (CCD) pixels. The optical detection regions P are actual light receiving portions of the CMOS pixels or the CCD pixels and regions other than the optical detection regions P are light non-receiving regions such as circuit areas.

The optical information detector 100 includes an optical information processor 120. The optical information processor 120 determines a distribution pattern of valid detection pixels and invalid detection pixels in an image of a data page detected by the optical detection unit 110 by the use of a light intensity distribution of the detected image.

The optical information processor 120 divides the detected image into balanced codeword detecting areas corresponding to balanced codewords of the source data page and samples data of the balanced codeword detecting areas by the use of the determined distribution pattern and a unique optical distribution characteristic of the balanced codewords.

Here, a valid detection pixel is a detection pixel of which the value can be sampled and used without any change. That is, the valid detection pixel is a detection pixel detecting only the value of the corresponding data pixel.

An invalid detection pixel is a detection pixel of which the value cannot be used for sampling without any change, but should be corrected through a predetermined calculation for use in sampling. That is, the invalid detection pixel is a detection pixel simultaneously detecting the values of a plurality of data pixels.

The concept and the distribution characteristic of the valid detection pixel and the invalid detection pixel will be described in detail later.

The optical information processor 120 includes a frame mark detecting area detector 121 calculating light intensity distributions of detection pixel columns and detection pixel rows of the detected image of the data page detected by the optical information detector 110 and detecting a frame mark detecting area, a valid/invalid detection pixel distribution determining unit 122 determining a matching state of the detected image by the use of the light intensity distribution of the detected frame mark detecting area and detecting the distribution characteristic of the valid detection pixels and the invalid detection pixels on the basis of the determined matching state, and a sampling unit 130 dividing the detected image into balanced codeword detecting areas corresponding to a balanced codeword of the source data page and sampling data of the balanced codeword detecting areas by the use of the distribution pattern determined by the valid/invalid detection pixel distribution determining unit 122 and the unique optical distribution characteristic of the balance codeword.

Figure 4:
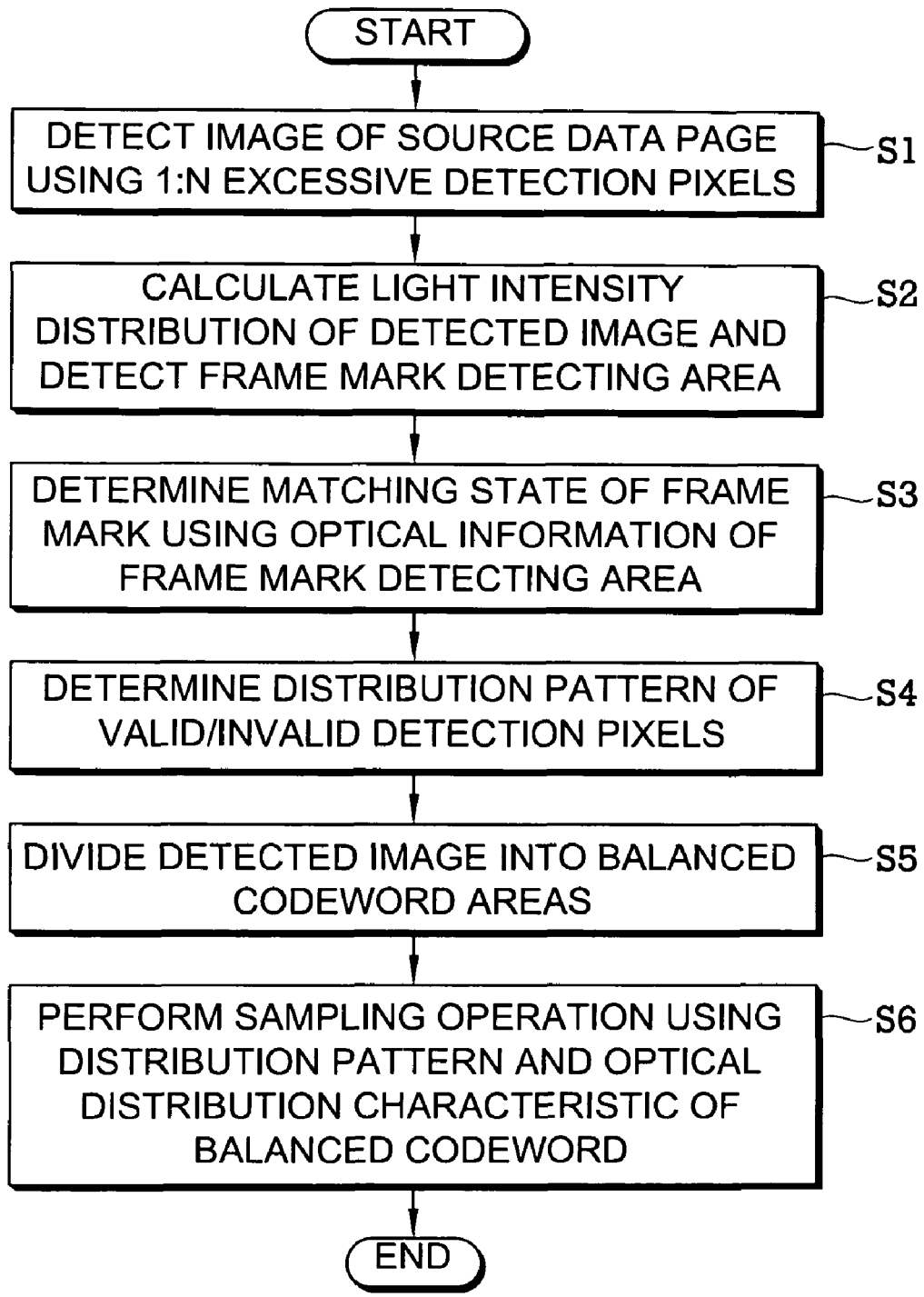
FIG. 4 is a flowchart illustrating an optical information detecting method according to an exemplary embodiment of the invention.

FIG. 4 is a flowchart illustrating an optical information detecting method according to an exemplary embodiment of the invention. The optical information detecting method can be performed by the optical information detector 100 shown in FIG. 2. The optical information detecting method according to an exemplary embodiment of the invention is now described with reference to FIGS. 2 and 4.

As shown in FIG. 4, the optical detection unit 110 detects an image of a data page which is stored in the optical information recording medium and reproduced in response to irradiation of a reference beam, that is, an image of a source data page by the use of 1:N (where N is greater than 1) excessive detection pixels (S1).

The structure shown in FIG. 3 can be used as the structure of the detection pixels of the optical detection unit 110. That is, the vertical width of the detection region P is a half of the vertical width of the detection pixel C. However, such a structure can be modified variously depending upon environments.

Figure 5:
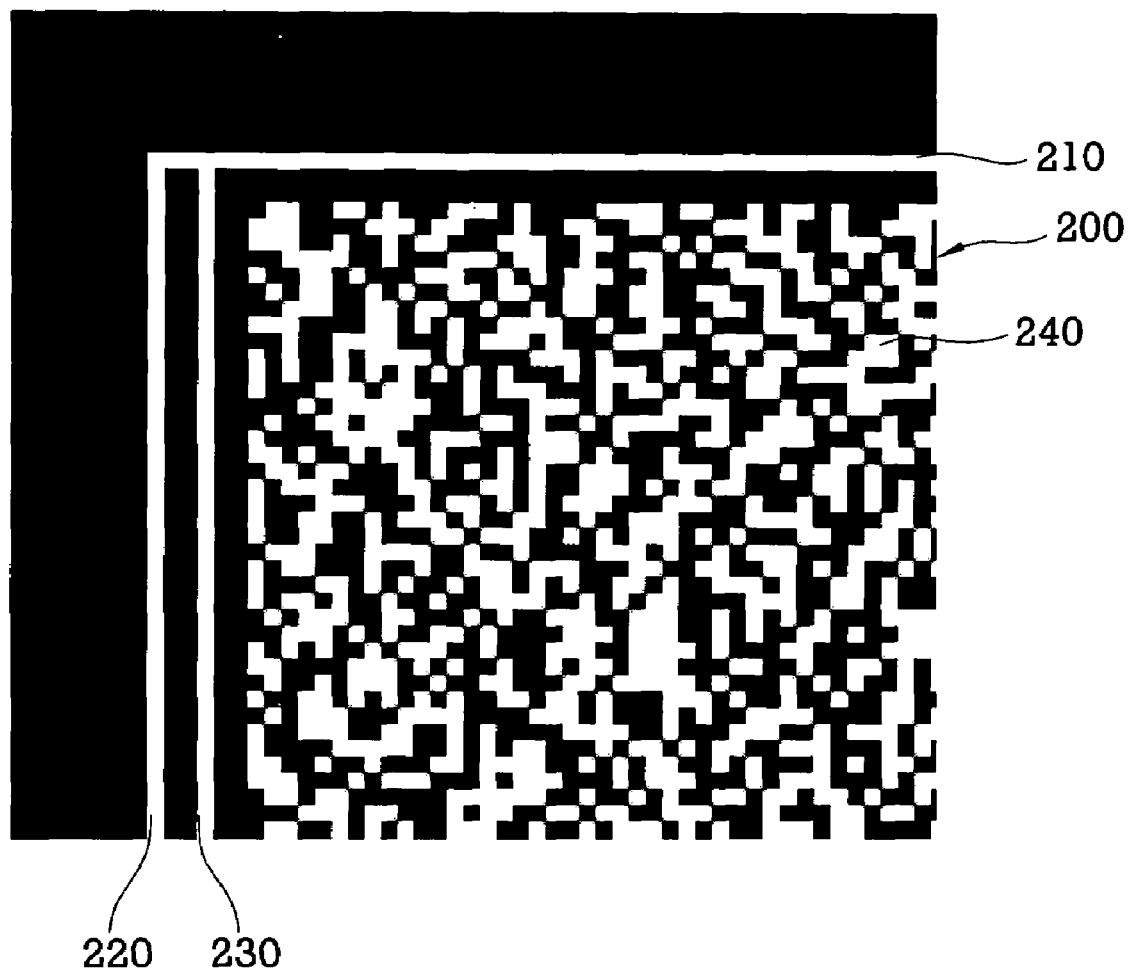
FIG. 5 is a diagram illustrating an image of a source data page reproduced by a reference beam.
Figure 6:
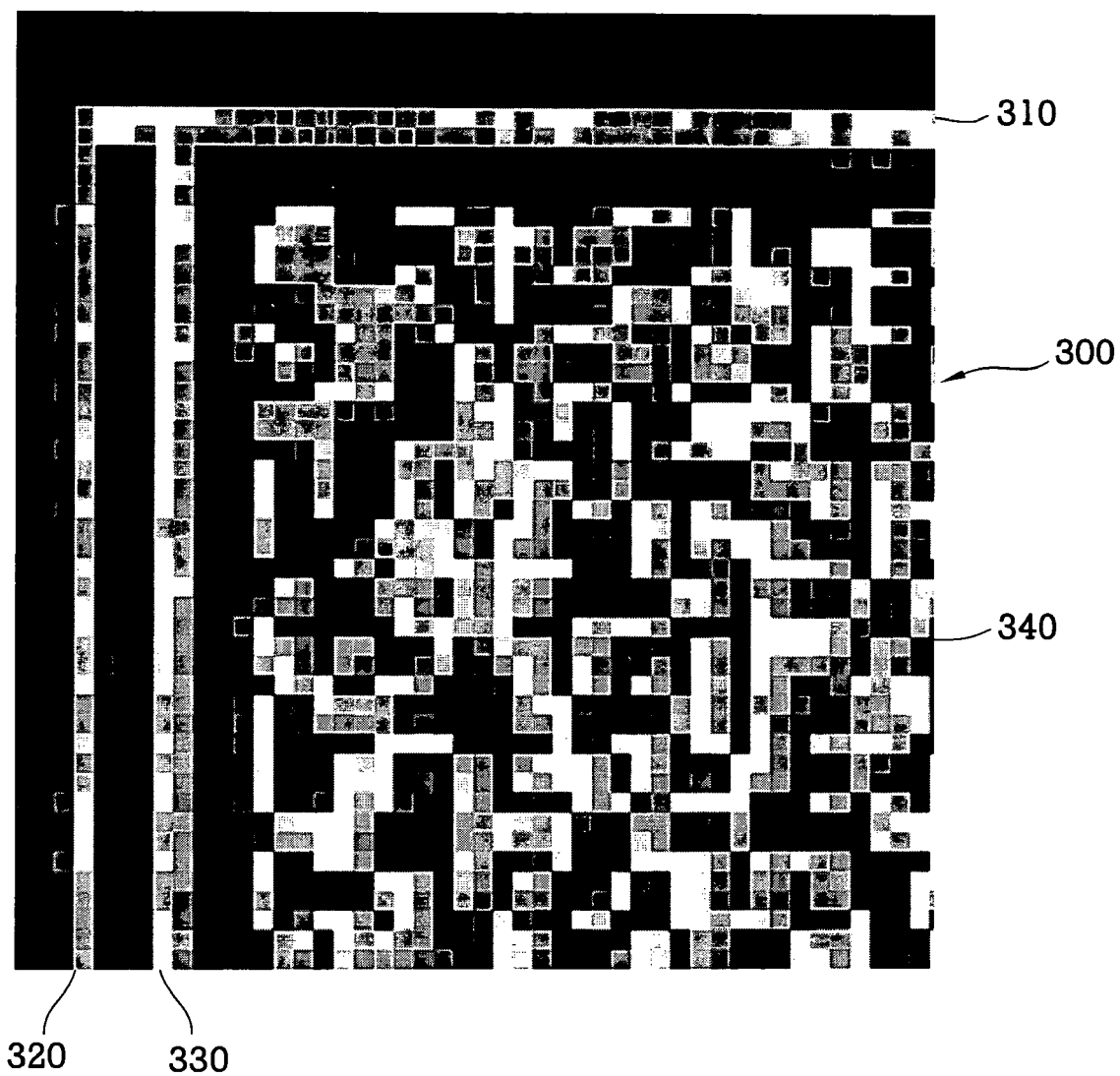
FIG. 6 is a diagram illustrating an image of a source data page detected by the optical detection unit.

FIG. 5 is a diagram illustrating an image of a source data page reproduced by a reference beam and FIG. 6 is a diagram illustrating a detected image of a source data page detected by the optical detection unit.

Referring to FIG. 5, the source data page 200 includes a data area 240 containing data and frame marks 210, 220, and 230 for distinguishing the position and range of the data area 240.

The data area 240 is coded with a balanced codeword. The balanced code is a code used for decreasing a bit error rate (BER) of a reproduced signal. At the time of recording optical information, input digital data are partitioned into p-bit blocks and then each block is converted into a q-bit balanced codeword in which the number of "1" and the number of "0" are equal to each other. The operation is called p:q balanced coding operation.

For example, in case of 6:8 balanced coding, 6-bit binary data can be converted into a 8-bit balanced codeword in which the number of "1" is equal to the number of "0." 64 information pieces of the 6-bit binary data are associated with combinations in which the number of "1" is equal to the number of "0" in 8 bits.

On the other hand, the frame marks 210, 220, and 230 are formed in a frame shape outside the data area 240 and can include a horizontal frame mark 210 and vertical frame marks 220 and 230. The vertical frame marks 220 and 230 may include a first vertical frame mark 220 and a second vertical frame mark 230. Here, the frame marks may be modified in various shapes from which the horizontal matching state and the vertical matching state can be distinguished, as well as the frame shape.

The horizontal frame mark 210 is composed of a data pixel row in which data pixels having an ON value are continuously arranged. The first vertical frame mark 220 and the second vertical frame mark 230 are composed of a data pixel column in which data pixels having an ON value are continuously arranged. The structure of the frame marks may be modified variously depending upon environments.

The source data page 200 having such a configuration is detected as shown in FIG. 6 by the optical detection unit 110. Referring to FIG. 6, the detected image 300 includes a data detecting area 340 corresponding to the data area 240 of the source data page 200 and frame mark detecting areas 310, 320, and 330 corresponding to the frame marks 210, 220, 230 of the source data page 200.

The frame mark detecting areas 310, 320, and 330 can be divided into a horizontal frame mark detection area 310 and vertical frame mark detecting areas 320 and 330 detected to correspond to the horizontal frame mark 210 and the vertical frame marks 220 and 230.

Since the data pixels having an ON value are continuously arranged in the frame marks, the frame marks 210, 220, and 230 have a light intensity much larger than that of the other areas thereof. Accordingly, the frame mark detecting areas 310, 320, and 330 detected to correspond to the frame marks 210, 220, and 230 have a light intensity much larger than that of the other areas of the detected image 200.

The frame mark detecting area detector 121 detects the frame mark detecting areas 310, 320, and 330 by calculating the light intensity distribution of the detected image 300 (S2).

That is, the frame mark detecting area detector 121 detects the horizontal frame mark detecting area 310 by calculating the sum of the light intensities of the detection pixels in the detection pixel rows of the detected image 300 of the data page detected by the optical detection unit 110 and then detecting an area including the detection pixel row having the sum of the light intensities much larger than that of the other areas.

Similarly, the frame mark detecting area detector 121 detects the first vertical frame mark detecting area 320 and the second vertical frame mark detecting area 330 by calculating the sum of the light intensities of the detection pixels in the detection pixel columns of the detected image 300 of the data page and then detecting an area including the detection pixel row having the sum of the light intensities much larger than that of the other areas.

Here, the detected image 300 is an image obtained by detecting the source data page 200 by the use of the 1:1.5 excessive detection pixels. Accordingly, even when the frame marks 210, 220, and 230 of the source data page 200 have only one data pixel column or one data pixel row, a plurality of detection pixel columns or detection pixel rows can be detected from the detected image 300. For example, the vertical frame mark detection areas 320 and 330 can be detected as three detection pixel columns and the horizontal frame mark detecting area 310 can be detected as two detection pixel rows.

By using the light intensity distribution of the detection pixel columns or the detection pixel rows in the frame mark detecting areas 310, 320, and 330, it is possible to detect a matching state between the source data page 200 and the detected image 300.

The valid/invalid detection pixel distribution determining unit 122 determines the matching states of the frame marks 210, 220, and 230 by the use of the optical information of the horizontal frame mark detecting area 310 and the vertical frame mark detecting areas 320 and 330 detected by the frame mark detecting area detector 121 (S3).

Figure 7:
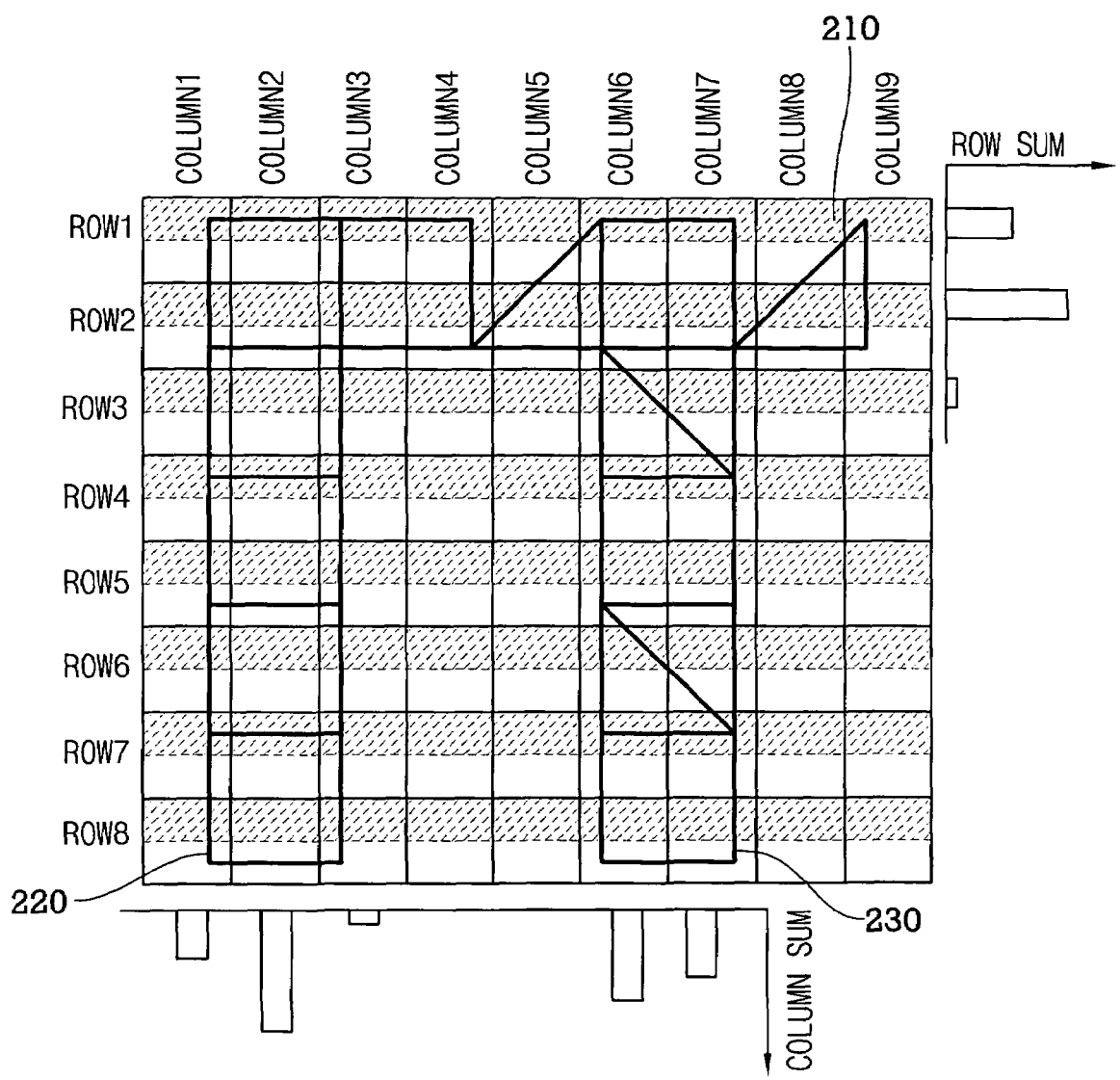
FIG. 7 is a diagram illustrating a matched state of a frame mark detecting area with a light intensity distribution of a detected image.

FIG. 7 is a diagram illustrating a matching state of a frame mark detecting area with a light intensity distribution.

In FIG. 7, small grids denote the detection pixels and large grids denote the data pixels. Reference numerals marked in the upper side and the left side of FIG. 7 denote detection pixel column numbers and detection pixel row numbers, and graphs illustrated in the lower side and the right side of the figure show sums of light intensities in the detection pixel columns and the detection pixel rows. The hatched portions in the detection pixels denote the detection regions of the detection pixels.

Referring to FIG. 7, it can be seen that the sums of light intensities of Row 1 and Row 2 among the detection pixel rows Row 1, Row 2, . . . in the detected image of the data page are much larger than those of the other detection pixel rows and Row 2 has the sum of light intensities larger than that of Row 1.

Accordingly, as shown in FIG. 7, it can be determined that the horizontal frame mark 210 is validly detected from Row 2. The reason is as follows. Since the vertical width of a detection region in each detection pixel of the optical detection unit 110 is a half of the vertical width of a detection pixel, the horizontal frame mark 210 can be detected by two detection pixel rows in maximum and one detection pixel row thereof can validly detect the horizontal frame mark.

On the other hand, the first vertical frame mark 220 is validly detected by Column 2. This is because the first vertical frame mark 220 is detected in a distributive manner by Column 1, Column 2, and Column 3, but the sum of light intensities of Column 2 is much larger than those of Column 1 and Column 3.

The second vertical frame mark 230 is validly detected in a distributive manner by Column 6 and Column 7. This is because the second vertical frame mark 230 has a much sum of light intensities in Column 6 and Column 7 than those of the other areas, but the sums of light intensities of Column 6 and Column 7 are equal to each other and are smaller than that of Column 2.

In this way, by using the light intensity distributions of Row 1 and Row 2 which are the horizontal frame mark detecting area, Column 1, Column 2, and Column 3 which are the first vertical frame mark detecting area, and Column 6 and Column 7 which are the second vertical frame mark detecting area, it is possible to determine the matching state of the frame mark. It is possible to find out a distribution pattern of the valid detection pixels and the invalid detection pixels in the detected image of the data page by the use of the determination result.

Subsequently, an operation of determining the distribution pattern of the valid detection pixels and the invalid detection pixels in the detected image of the data page is performed (S4). The operation can be performed by the valid/invalid detection pixel distribution determining unit 122.

As described above, the valid detection pixel is a detection pixel of which the value can be sampled and used without any change. That is, the valid detection pixel is a detection pixel detecting only the value of the corresponding data pixel. On the contrary, the invalid detection pixel is a detection pixel of which the value cannot be used for sampling without any change but should be corrected through a predetermined calculation for use in sampling. That is, the invalid detection pixel is a detection pixel simultaneously detecting the values of a plurality of data pixels.

Figure 8:
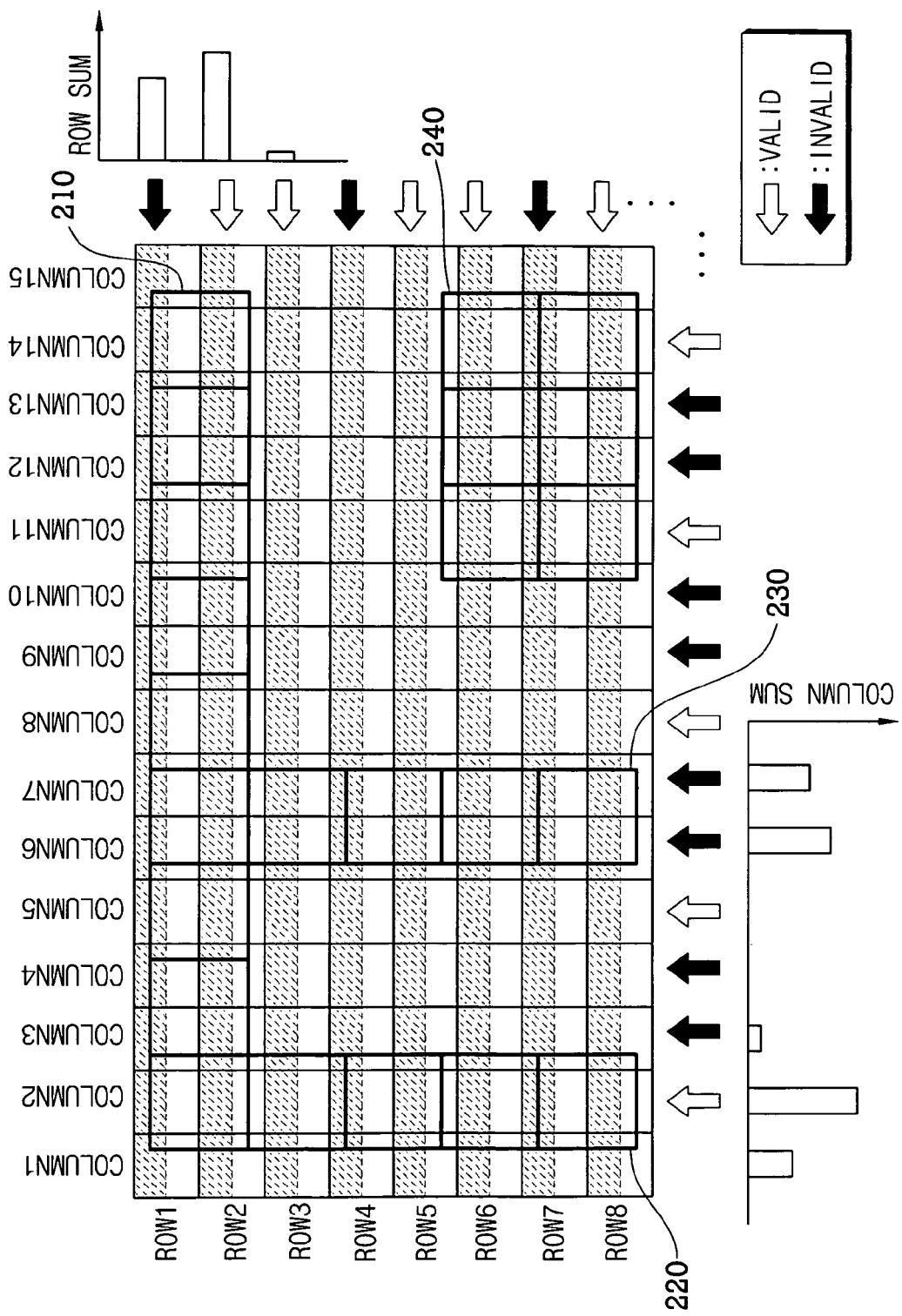
FIG. 8 is a diagram illustrating a distribution pattern of detection pixels in the matched state shown in FIG. 7.

FIG. 8 is a diagram illustrating a distribution pattern of the detection pixels in the matched state shown in FIG. 7.

The valid detection pixel can be detected by finding out an intersection between the valid detection pixel row and the valid detection pixel column. At this time, the valid detection pixel row is a row of detection pixels detecting the optical information of only one data pixel row and the invalid detection pixel row is a row of detection pixels simultaneously detecting the optical information of a plurality of data pixel rows. Similarly, the valid detection pixel column is a column of detection pixels detecting the optical information of only one data pixel column and the invalid detection pixel column is a column of detection pixels simultaneously detecting the optical information of a plurality of data pixel columns. Accordingly, the intersection between the valid detection pixel row and the valid detection pixel column is a valid detection pixel.

Referring to FIG. 8, the detection pixel rows in the detected image of the data page have a distribution pattern in which two valid detection pixel rows and one invalid detection pixel row are repeated.

For example, Row 2 accurately detects the optical information of only the horizontal frame mark 210 and thus Row 2 is a valid detection pixel row. Row 3 is a valid detection pixel row, Row 4 is an invalid detection pixel row, Row 5 is a valid detection pixel row, Row 6 is a valid detection pixel row, Row 7 is an invalid detection pixel row, and Row 8 is a valid detection pixel row. Accordingly, the pattern of the detection pixel rows means a valid and invalid pattern in the vertical direction.

Since the data pixel and the detection pixel is at a ratio of 1:1.5 and the vertical width of the detection region is a half of the vertical width of the detection pixel, all the data pixel rows are detected by at least one valid detection pixel row. Accordingly, in order to sample values of a specific data pixel row, the valid detection pixel rows can be selected on the basis of the pattern and does not require an addition correction.

On the other hand, a data pixel row may be perfectly matched with a detection pixel row in the vertical direction. At this time, two valid detection pixel rows can detect one data pixel row at the same time. In this case, only one detection pixel row can be selected for detection among the two detection pixel rows.

Therefore, since any data pixel row can be detected by the valid detection pixels, a correction due to the invalid detection is not necessary in the vertical direction.

On the contrary, the detection pixel columns in the detected image of the data page have a pattern in which one valid detection pixel column and two invalid detection pixel columns are repeated.

For example, since Column 2 from which the first vertical frame mark 220 is accurately detected can be determined as a valid detection pixel column, Column 3 is an invalid detection pixel column, Column 4 is an invalid detection pixel column, Column 5 is a valid detection pixel column, Column 6 is an invalid detection pixel column, Column 7 is an invalid detection pixel column, and Column 8 is a valid detection pixel column.

The pattern of the detection pixel columns is a valid and invalid pattern in the horizontal direction.

Since the data pixel and the detection pixel are in the ratio of 1:1.5 and the horizontal width of a detection region is equal to the horizontal width of a detection pixel, the data pixel column can be detected by the valid detection pixel column, but may be detected by the invalid detection pixel column in some cases. For example, it can be seen that the second vertical frame mark 230 is detected by Column 6 and Column 7 which are the invalid detection pixel columns. Accordingly, an additional correction due to the invalid detection is necessary in the horizontal direction.

When the distribution pattern of the valid detection pixels and the invalid detection pixels are determined in this way, the data detecting area of the detected image is divided into balanced codeword detecting areas corresponding to balanced codewords of the source data page (S5), and the values of the respective balanced codeword detecting areas are sampled by the use of the distribution pattern and an optical distribution characteristic of the balanced codewords (S6).

Figure 9:
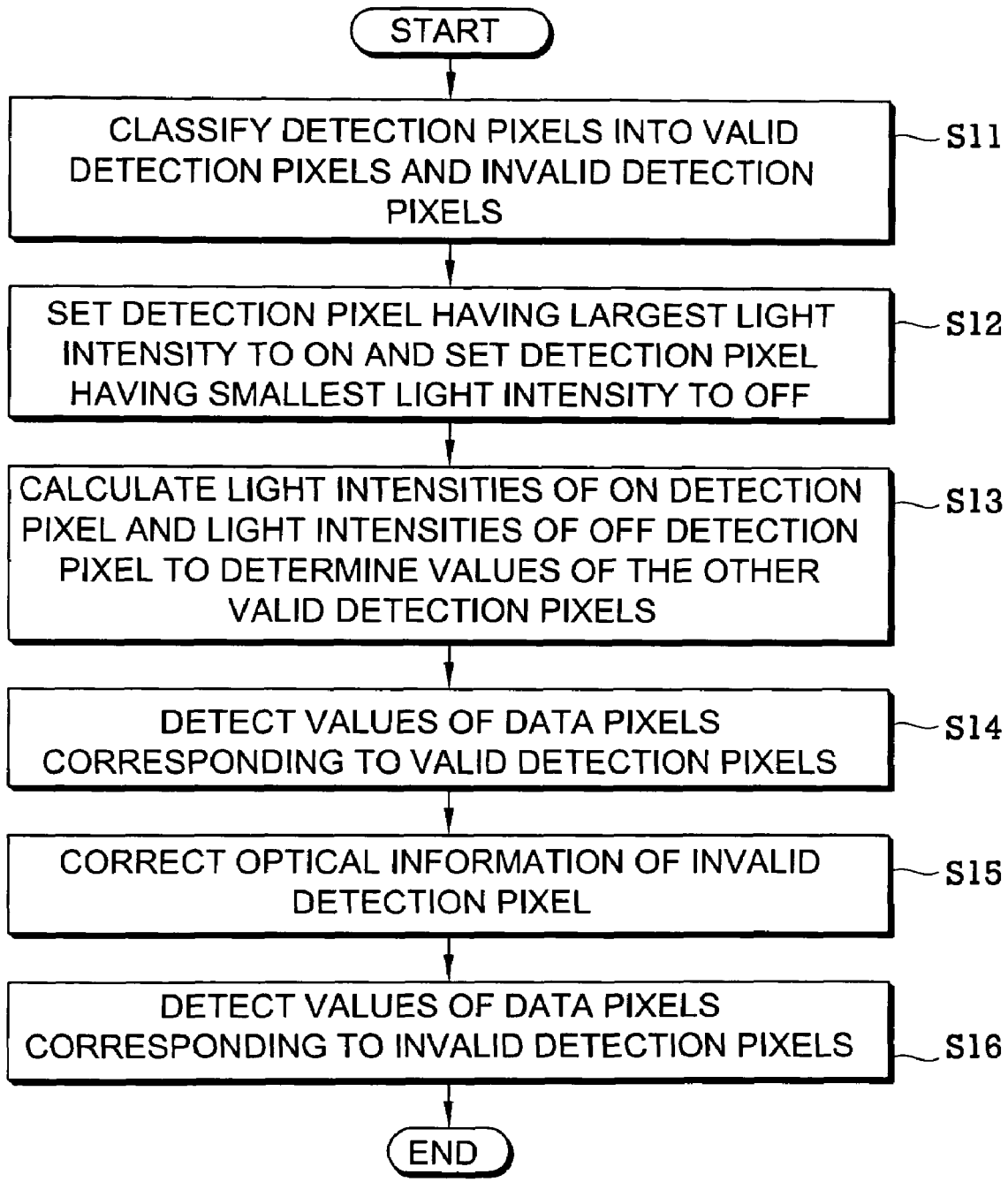
FIG. 9 is a flowchart illustrating a process of distinguishing and sampling balanced codeword detecting areas.
Figure 10:
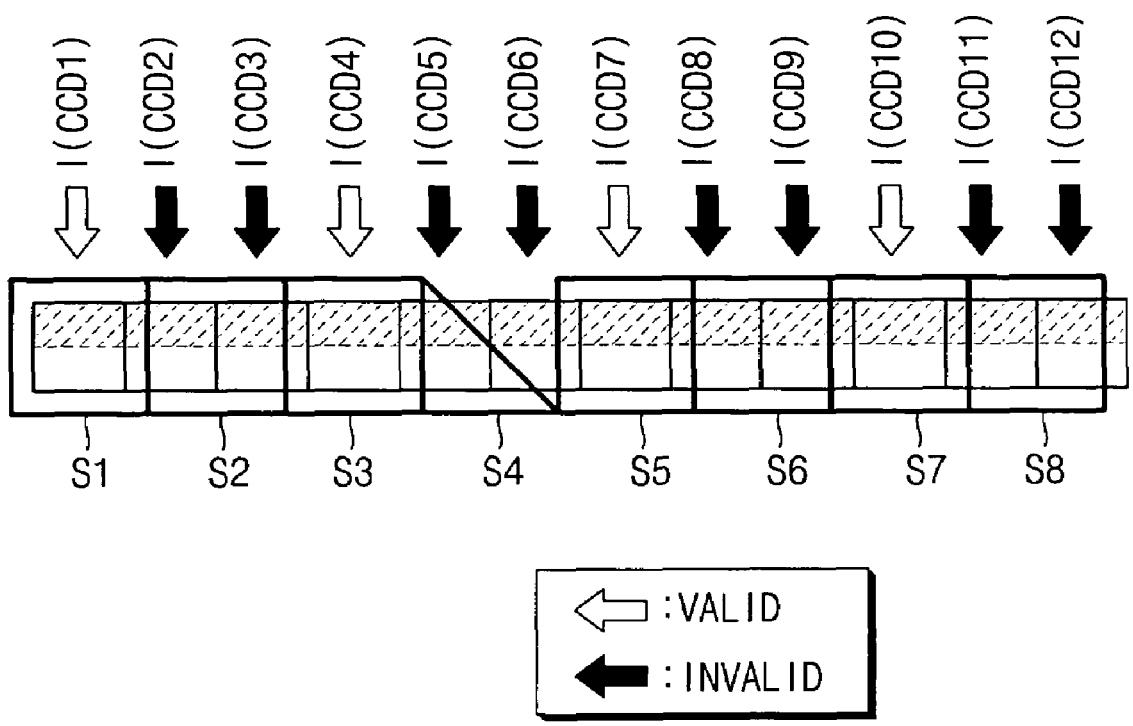
FIG. 10 is a diagram illustrating one balanced codeword detecting area.

FIG. 9 is a flowchart illustrating the operation of sampling the balanced codeword detecting areas. FIG. 10 is a diagram illustrating one balanced codeword detecting area. In the figure, a relation between a 6:8 balanced codeword and the balanced codeword detecting area from which the balanced codeword has been detected is shown. In FIG. 10, small grids denote the detection pixels and large grids denote the data pixels. The hatched portions in the detection pixels denote the detection regions.

The operation of sampling the balanced codeword detecting areas will be now described in detail with reference to FIGS. 9 and 10.

As shown in FIG. 10, in the 1:1.5 over-sampling, a balanced codeword having 8 data pixels corresponds to a balanced codeword detecting area having 12 detection pixels.

Since the balanced codeword detecting area has a structure in which a plurality of detection pixels is arranged horizontally, one valid detection pixel and two invalid detection pixels are repeated like the distribution of detection pixels in the horizontal direction.

Accordingly, the valid detection pixels and the invalid detection pixels in the balanced codeword detecting area are classified by the use of the distribution pattern (S11). Since any correction due to the invalid detection is not necessary in the vertical direction as described above, it is not necessary to consider the vertical correction.

For example, when the first detection pixel ccd1 in FIG. 10 is a valid detection pixel, the detection pixels ccd1, ccd4, ccd7, and ccd10 are valid detection pixels among the detection pixels ccd1 to ccd12 in the balanced codeword detecting area and the other detection pixels ccd2, ccd3, ccd5, ccd6, ccd8, ccd9, ccd11, ccd12 are invalid detection pixels.

In this case, ccd1 corresponds to the first data pixel S1, ccd4 corresponds to the third data pixel S3, ccd7 corresponds to the fifth data pixel S5, and ccd10 corresponds to the seventh data pixel S7. Accordingly, the values of the data pixels S1, S3, S5, and S7 can be detected from the optical information of the valid detection pixels ccd1, ccd4, ccd7, and ccd10.

Since the optical information of the valid detection pixels ccd1, ccd4, ccd7, and ccd10 is simple light intensity information, it should be determined whether the optical information of the respective detection pixels is an ON value or an OFF value, so as to convert the optical information into binary data.

A unique optical distribution characteristic of the balanced codeword can be used for the determination. The unique optical distribution characteristic of the balanced codeword is that the number of ON pixels in the balanced codeword is always equal to the number of OFF pixels. Another characteristic of the balanced codeword is that the ON pixels and the OFF pixels in the balanced codeword are not alternately arranged. This is because the entire signal-to-noise ratio (SNR) is considerably degraded due to the influence of the neighboring ON pixels when the ON pixel and the OFF pixel are continuously arranged. Accordingly, the alternate arrangement of the ON and OFF pixels is not used for the balanced codeword.

Because of the characteristic of the balanced codeword, the optical information of the valid detection pixels ccd1, ccd4, ccd7, and ccd10 necessarily have one of the ON value and the OFF value.

Accordingly, the valid detection pixel having the largest light intensity among the valid detection pixels is sampled to have the ON value, and the valid detection pixel having the smallest light intensity is sampled to have the OFF value (S12). As a result, the values of two data pixels among the data pixels in the balanced codeword can be detected.

At this time, the light intensity Imax of the ON detection pixel detected through the above-mentioned operation can be expressed by Expression 1.

$$Imax = Max\{I(ccd1), I(ccd4), I(ccd7), I(ccd10)\} \quad \text{Expression 1}$$

Here, I(ccd#) denotes the light intensity of the corresponding detection pixel (# indicates the pixel number).

The light intensity Imin of the OFF detection pixel detected through the above-mentioned operation can be expressed by Expression 2.

$$Imin = Min\{I(ccd1), I(ccd4), I(ccd7), I(ccd10)\} \quad \text{Expression 2}$$

On the other hand, the values of the remaining two valid detection pixels not determined are detected by the use of the light intensity Imax of the detected ON detection pixel and the light intensity Imin of the detected OFF detection pixel (S13).

First, the remaining ON detection pixel Iccd#(on) can be determined by Expression 3.

$$Iccd\#(on) > (Imax - Imin)/2 + Imin \quad \text{Expression 3}$$

That is, the remaining ON detection pixel is determined as a valid detection pixel having a light intensity larger than a value, which is obtained by adding the smallest light intensity to the value obtained by subtracting the smallest light intensity from the largest light intensity and then dividing the resultant value by 2.

Reversely, the remaining OFF detection pixel Iccd#(off) can be determined by Expression 4.

$$Iccd\#(off) < (Imax - Imin)/2 + Imin \quad \text{Expression 4}$$

That is, the remaining OFF detection pixel is determined as a valid detection pixel having a light intensity smaller than a value, which is obtained by adding the smallest light intensity to the value obtained by subtracting the smallest light intensity from the largest light intensity and then dividing the resultant value by 2.

In this way, when all the values of the valid detection pixels ccd1, ccd4, ccd7, and ccd10 are obtained, the values are detected as the values of the data pixels S1, S3, S5, and S7 of the corresponding balanced codeword (S14). Accordingly, the values of the data pixels corresponding to the valid detection pixels are all detected.

On the other hand, the operation of calculating the values of the valid detection pixels may be performed by the following method. That is, first, among the valid detection pixels, the detection pixel having the largest light intensity is sampled to have the ON value and the detection pixel having the smallest light intensity is sampled to have the OFF value. Then, the detection pixel having a half or more of the light intensity of the ON detection pixel is determined as the other ON detection pixel and the detection pixel having a half or less of the light intensity of the ON detection pixel is determined as the other OFF detection pixel.

This operation can be expressed by Expression 5 and Expression 6.

$$Iccd\#(on) > Imax/2 \quad \text{Expression 5}$$

$$Iccd\#(off) < Imax/2 \quad \text{Expression 6}$$

When the process of sampling the valid detection pixels (S12 to S14) is finished, the optical information of the remaining invalid detection pixels is corrected (S15) and the corresponding data pixels are detected (S16). In this course, the calculation of the values of the invalid detection pixels and the values of the neighboring valid detection pixels should be considered.

Figure 11:
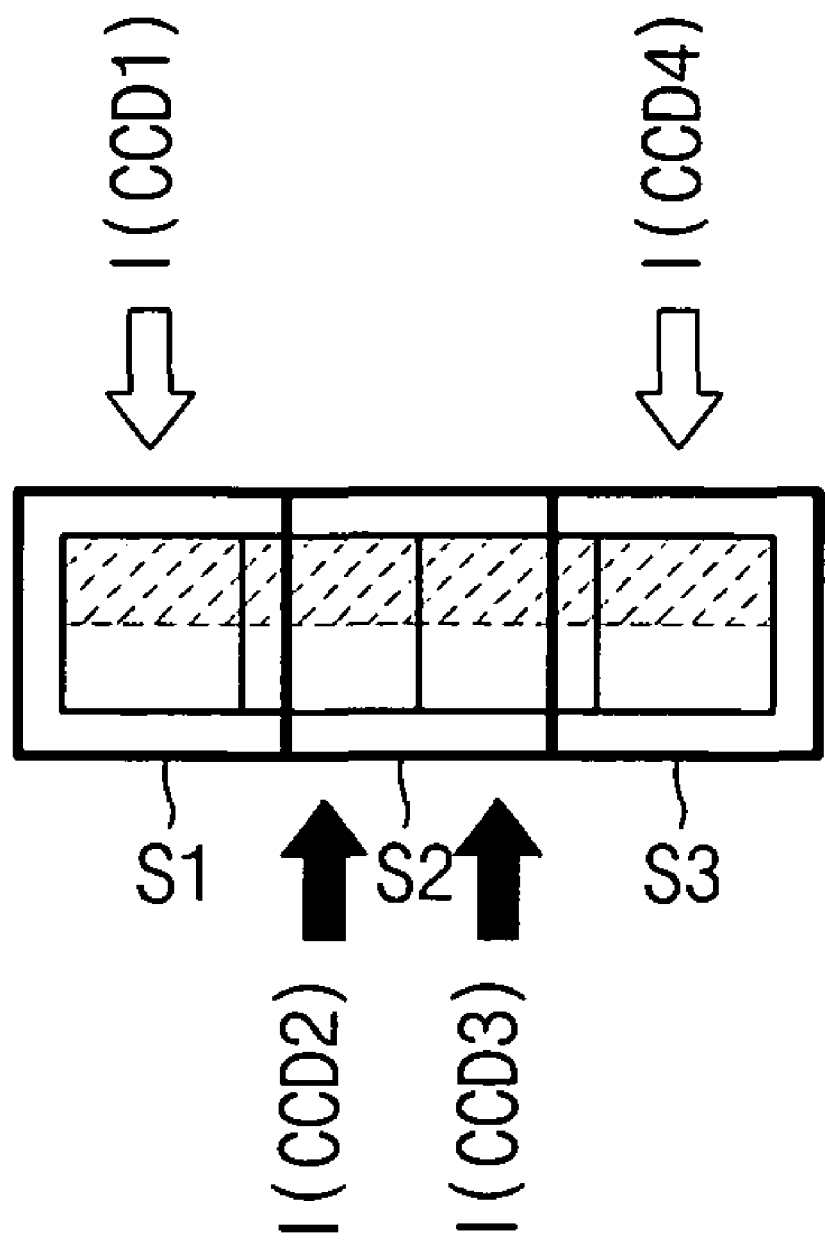
FIG. 11 is a diagram illustrating a part for detecting values of data pixels corresponding to detection pixels ccd2 and ccd3 among invalid detection pixels shown in FIG. 10.

FIG. 11 is a diagram illustrating a part for detecting the values of the data pixels corresponding to the detection pixels ccd2 and ccd3 among the invalid detection pixels shown in FIG. 10. Here, the values of the data pixels corresponding to the remaining invalid detection pixels can be detected similarly.

Referring to FIG. 11, since the data pixel S2 corresponds to two invalid detection pixels ccd2 and ccd3, the total light intensity detected by the two detection pixels ccd2 and ccd3 should be converted in a unit of one detection pixel so as to obtain the value of the data pixel S2.

That is, an average value is calculated by dividing the sum of the light intensities of the detection pixels ccd2 and ccd3. This operation can be expressed by Expression 7.

$$Iav = \{I(ccd2) + I(ccd3)\}/2 \quad \text{Expression 7}$$

Here, Iav denotes the average value of the light intensities of the detection pixels ccd2 and ccd3.

The optical information of the data pixel S1 is included in the light intensity of the detection pixel ccd2. Similarly, the optical information of the neighboring data pixel S3 is included in the light intensity of the detection pixel ccd3.

Accordingly, the optical influence of the data pixels S1 and S3 adjacent to the data pixel of which Iav is calculated should be removed. The degree of influence of the data pixel S1 on the detection pixel ccd2 should be first detected. The degree of influence can be detected by the use of the vertical frame detecting area described above.

That is, when the data pixel S1 has the ON value, the light intensity of the detection pixel ccd2 can be calculated by the first vertical frame mark detecting area described with reference to FIG. 7. Referring to FIG. 7 for the purpose of easy understanding, the first vertical frame mark detecting area is detected by the detection pixel columns Column 1, Column 2, and Column 3. Actually, the valid detection pixel column accurately detecting the first vertical frame mark is Column 2 and the optical information detected from Column 3 affects the light intensity of the first vertical frame mark which is the neighboring data pixel column. Accordingly, by dividing the light intensity of Column 3 by the number of detection pixels in Column 3, the light intensity of the detection pixel ccd2 can be calculated when the data pixel S1 has the ON value.

This operation can be expressed by Expression 8.

$$A=\Sigma(ICCDk+1)/M \qquad \text{Equation 8}$$

Here, A denotes the light intensity of the detection pixel ccd2 when the data pixel S1 has the ON value and I(CCDk+1) denotes the sum of light intensities of the detection pixel column next to the detection pixel column having the largest light intensity. M denotes the number of detection pixels in the next detection pixel column.

Similarly, when the data pixel S3 has the ON value, the light intensity of the detection pixel ccd3 can be obtained. This operation can be expressed by Expression 9.

$$B=\Sigma(ICCDk-1)/L \qquad \text{Equation 9}$$

Here, B denotes the light intensity of the detection pixel ccd3 when the data pixel S3 has the ON value, and I(CCDk-1) denotes the sum of light intensities of the detection pixel column previous to the detection pixel column having the largest light intensity. L denotes the number of detection pixels in the previous detection pixel column.

In this way, when the light intensities A and B unnecessarily detected from the data pixel S1 and the data pixel S3 are obtained, A or B is subtracted from the average value Iav of the light intensities of the detection pixels ccd2 and ccd3, in consideration of the values of the data pixel S1 and the data pixel S3.

The values of the data pixel S1 and the data pixel S3 can be classified into four kinds. Here, the values of the data pixel S1 and the data pixel S3 are previously obtained in the course of sampling the valid detection pixels described above.

First, when the data pixel S1 has the ON value and the data pixel S3 has the OFF value, the data pixel S1 affects the detection pixel ccd2 and thus A is subtracted from Iav. At this time, when the data pixel S3 has the OFF value, the data pixel S3 does not affect the detection pixel ccd3, and thus B is not subtracted therefrom.

The average value Iav2 of the detection pixels ccd2 and ccd3 from which the unnecessary optical information is removed can be expressed by Expression 10.

$$Iav2=Iav-A \qquad \text{Expression 10}$$

When the data pixel S1 has the OFF value and the data pixel S3 has the ON value, the data pixel S1 does not affect the detection pixel ccd2, but the data pixel S3 affects the detection pixel ccd3. Accordingly, B is subtracted from Iav. In this case, the average value Iav2 from which the unnecessary optical information is removed can be expressed by Expression 11.

$$Iav2=Iav-B \qquad \text{Expression 11}$$

When the data pixel S1 and the data pixel S3 have the ON value, both data pixels affect the detection pixels ccd2 and ccd3. Accordingly, A and B are subtracted from Iav. In this case, the average value Iav2 from which the unnecessary optical information is removed can be expressed by Expression 12.

$$Iav2=Iav-A-B \qquad \text{Expression 12}$$

Finally, when the data pixel S1 and the data pixel S3 have the OFF value, both data pixels do not affect the detection pixels ccd2 and ccd3. Accordingly, it is not necessary to subtract A or B from Iav.

In this way, the average value Iav2 of the detection pixels ccd2 and ccd3 from which the unnecessary optical information is removed is obtained. However, since the Iav2 is a light intensity not when the optical information of the data pixel S2 is detected by the use of one detection pixel, but when the optical information of the data pixel S2 is detected by the use of two detection pixels, Iav2 should be converted into the light intensity when one detection pixel receives a beam from one data pixel.

That is, since the horizontal width of the data pixel is a half of the horizontal width of the detection pixel, by multiplying Iav2 by 3/2, Iav2 can be converted into the light intensity of the data pixel S2 to be detected.

This operation can be expressed by Expression 13.

$$Is2=Iav\times\tfrac{2}{3} \qquad \text{Expression 13}$$

In this way, the light intensity of the data pixel S2 is obtained. Similarly, the light intensities of the data pixels S4, S6, and S8 shown in FIG. 10 can be calculated.

When all the light intensities of the data pixels S4, S6, and S8 are calculated, it should be determined whether the calculated light intensities are the ON value or the OFF value and then the light intensities should be digitalized. This operation can be performed in the same way as the process of detecting the data pixels S1, S3, S5, and S7 described above.

First, among the calculated light intensities of the data pixels S2, S4, S6, and S8, the largest light intensity is determined as the ON value and the smallest light intensity is determined as the OFF value.

The largest light intensity Ismax and the smallest light intensity Ismin can be expressed by Expression 14 and Expression 15.

$$I\text{smax}=\text{Max}\{I(S2),I(S4),I(S6),I(S8)\} \qquad \text{Expression 14}$$

Here, I(S#) indicates the light intensity of the corresponding data pixel (where # denotes the pixel number).

$$I\text{smax}=\text{Min}\{I(S2),I(S4),I(S6),I(S8)\} \qquad \text{Expression 15}$$

In this way, when the values of two data pixels are obtained, it can be determined from Expression 16 and Expression 17 whether the remaining two data pixels have the ON value or the OFF value. That is, the data pixel Is#(on) having the ON value can be determined by the use of Expression 16.

$$Is\#(\text{on})>(I\text{smax}-I\text{smin})/2+I\text{smin} \qquad \text{Expression 16}$$

The data pixel Is#(off) having the OFF value can be determined by the use of Expression 17.

$$Is\#(\text{off})<(I\text{smax}-I\text{smin})/2+I\text{smin} \qquad \text{Expression 17}$$

Expressions 16 and 17 are similar to Expressions 3 and 4 in concept.

That is, the ON data pixel is a data pixel having a light intensity larger than a value, which is obtained by adding the smallest light intensity to the value obtained by subtracting the smallest light intensity from the largest light intensity and then dividing the resultant value by 2. On the contrary, the data pixel having a light intensity smaller than the value is determined as an OFF data pixel.

The process of determining whether the remaining two data pixels have the ON value or the OFF value can be performed by the use of the same concepts as Expressions 5 and 6. That is, when the largest light intensity is larger than ½, the data pixel is determined to have the ON value. When the largest light intensity is smaller than ½, the data pixel is determined to have the OFF value.

On the other hand, the process of determining whether the data pixels S2, S4, S6, and S8, that is, the data pixels detected by the invalid detection pixels, have the ON value or the OFF value can be performed using the numbers of ON and OFF values of the balanced codeword as follows.

For example, it is assumed that three data pixels have the ON value and one data pixel has the OFF value among the data pixels S1, S3, S5, and S7. In this case, at the time of determining whether the data pixels S2, S4, S6, and S8 have the ON value or the OFF value, only the ON data pixel having the largest light intensity is detected and then the other data pixels can be determined as the OFF data pixels without obtaining the light intensities thereof. This is because the number of ON data pixels in the balanced codeword is equal to the number of OFF data pixels.

For example, it is assumed that three data pixels have the OFF value and one data pixel has the ON value among the data pixels S1, S3, S5, and S7. In this case, at the time of determining whether the data pixels S2, S4, S6, and S8 have the ON value or the OFF value, only the OFF data pixel having the smallest light intensity is detected and then the other data pixels can be determined as the ON data pixels without obtaining the light intensities thereof.

For example, it is assumed that two data pixels have the ON value and two data pixels have the OFF value among the data pixels S1, S3, S5, and S7. In this case, at the time of determining whether the data pixels S2, S4, S6, and S8 have the ON value or the OFF value, the OFF data pixel having the smallest light intensity is detected and then the data pixel having the secondly smallest light intensity can be determined as the OFF data pixel. Similarly, the ON data pixel having the largest light intensity is detected and then the data pixel having the secondly largest light intensity can be determined as the OFF data pixel.

In this way, all the values of the data pixels S2, S4, S6, and S8 are detected and all the values of the data pixels S1, S3, S5, and S7 are detected by the use of the valid detection pixels as described above. Accordingly, all the values of the data pixels in the balanced codeword detected by the balanced codeword detecting area are detected.

When the values of the balanced codes in the data areas are all detected, the original data can be obtained by combining and decoding the values.

As described above, according to the present invention, it is possible to efficiently detect optical information stored in an optical information recording medium by using an 1:N oversampling operation (where N is greater than 1). Specifically, the distribution pattern of valid detection pixels and invalid detection pixels in the detected image of a data page can be properly used to sample a balanced code.

What is claimed is:

1. A method for detecting an optical information, the method comprising:
   detecting, at an optical detection unit coupled to an optical information processor, an image of a source data page coded with balanced codewords by the use of 1:N (where N is 1.33 or 1.5) excessive detection pixels, wherein the optical detection unit comprises N×N detection pixels per 1×1 data pixel of the source data page for detecting optical information by using the 1:N excessive detection pixels, and each excessive detection pixel detects the optical information using a detection region having a vertical width or a horizontal width smaller by a half than the vertical width or the horizontal width of each of the corresponding excessive detection pixel, wherein the detection region is configured to detect the image and the detection region and the corresponding excessive detection pixel are made of pixel sensors comprising one of complementary metal-oxide semiconductor (CMOS) pixels or charge-coupled device (CCD) pixels, and wherein the detection region locates at an upper, a center, or a lower portion of each of the corresponding excessive detection pixel;
   determining, at the optical information processor, a distribution pattern of valid detection pixels and invalid detection pixels to be corrected in the detected image by the use of a light intensity distribution of the detected image; and
   dividing the detected image into balanced codeword detecting areas corresponding to the balanced codewords and sampling data of the balanced codeword detecting areas by the use of the determined distribution pattern and an optical distribution characteristic of the balanced codewords.

2. The method according to claim 1, wherein the determining of the distribution pattern comprises:
   causing detection of a frame mark detection area corresponding to the frame mark of the source data page of the detected image; and
   causing determination of the distribution pattern of the valid detection pixels and the invalid detection pixels by using light intensity distributions of detection pixel columns and detection pixel rows of the detected frame mark detecting area.

3. The method according to claim 2, wherein the detecting of the frame mark detection area comprises detecting a sum of light intensities of the detection pixel column and the detection pixel row of the detected image and detecting an area including the detection pixel column and the detection pixel row having the sum of light intensities larger than that of the other areas.

4. The method according to claim 2, wherein the frame mark comprises one or more horizontal frame marks and one or more vertical frame marks, and wherein the distribution pattern in the horizontal direction is determined using light intensity distributions of a plurality of detection pixel rows of a horizontal frame mark detecting area detected to correspond to the one or more horizontal frame marks, and the distribution pattern in the vertical direction is determined using light intensity distributions of a plurality of detection pixel columns of a vertical frame mark detection area detected according to the one or more vertical frame marks.

5. The method according to claim 1, wherein the valid detection pixels are detection pixels detecting optical information of one data pixel and the invalid detection pixels are detection pixels detecting optical information of a plurality of data pixels.

6. The method according to claim 1, wherein the sampling of the data comprises:
   dividing the detected image into balanced codeword detecting areas corresponding to the balanced codewords;
   classifying the detection pixels in the balanced codeword detecting areas into the valid detection pixels and the invalid detection pixels on the basis of the light intensity distribution of the balanced codewords; and
   sampling the values of the valid detection pixels, and correcting and sampling the values of the invalid detection pixels by a predetermined calculation.

7. The method according to claim 6, wherein the sampling of the valid detection pixels and the invalid detection pixels comprises:
   causing determination of optical information of the valid detection pixels and detecting the values of the data pixels detected by the valid detection pixels; and causing detection of the values of the other data pixels in the balanced codeword by using the detected values of the data pixels and the optical information of the invalid detection pixels.

8. The method according to claim 7, wherein at the time of determining the optical information of the valid detection pixels, one valid detection pixel having the largest light intensity among the valid detection pixels is determined based on a detection pixel having an ON value and one valid detection pixel having the smallest light intensity is determined based on a detection pixel having an OFF value.

9. The method according to claim 8, wherein the light intensity of the detection pixel is determined based on a detection pixel having the ON value and the light intensity of the detection pixel is determined based on a detection pixel having the OFF value that are calculated, and the ON and OFF values of the other valid detection pixels are determined.

10. The method according to claim 7, wherein the detecting the values of the other data pixels comprises:
   causing calculation of the degree of influence of the optical information of the plurality of invalid detection pixels and the neighboring data pixels so as to detect the values of the data pixels detected by the invalid detection pixels, and detecting the optical information of the other data pixels; and
   causing detection of the ON/OFF value of the other data pixels by comparing the ON/OFF value of the other data pixels with the detected optical information of the other data pixels.

11. The method according to claim 10, wherein the detecting of the ON/OFF value comprises determining one or more data pixels having the largest light intensity among the other data pixels to have the ON value and determining one or more data pixels having the smallest light intensity to have the OFF value.

12. The method according to claim 11, wherein ON/OFF values of non-detected data pixels are determined by calculating the light intensity of the data pixel having the ON value and the light intensity of the data pixel having the OFF value.

13. The method according to claim 10, wherein the detecting of the ON/OFF value comprises determining the ON/OFF value of the other data pixels using a unique optical distribution characteristic of the balanced codeword based on the values of the detected data pixels in the balanced codeword.

14. An optical information detector comprising:
   an optical detection unit detecting an image of a source data page coded with balanced codewords by the use of 1:N over-sampling, wherein N is 1.33 or 1.5 and excessive detection pixels are arranged at a ratio of N×N detection pixels per 1×1 data pixel of the source data page, wherein the optical detection unit comprises a plurality of detection pixels for detecting optical information by the use of the 1:N excessive detection pixels, and each detection pixel detects the optical information using a detection region having one of a horizontal width or a vertical width smaller by a half than the vertical width or the horizontal width of each of the corresponding excessive detection pixel, wherein the detection region is configured to detect the image and the detection region and the corresponding excessive detection pixel are made of pixel sensors comprising one of complementary metal-oxide semiconductor (CMOS) pixels or charge-coupled device (CCD) pixels, and wherein the detection region locates at an upper, a center, or a lower portion of each of the corresponding detection pixel; and
   an optical information processor to determine a distribution pattern of valid detection pixels and invalid detection pixels in the detected image by the using a light intensity distribution of the detected image, to divide the detected image into balanced codeword detecting areas corresponding to the balanced codewords, and sampling data of the balanced codeword detecting areas by using the determined distribution pattern and an optical distribution characteristic of the balanced codewords.

15. The optical information detector according to claim 14, wherein the optical information processor comprises:
   a frame mark detecting area detector to detect a frame mark detecting area corresponding to the frame mark of the source data page by using light intensity distributions of detection pixel columns and detection pixel rows of the detected image;
   a valid/invalid detection pixel distribution determining unit to determine the distribution pattern of the detected image by using optical information of the detected frame mark detecting area; and
   a sampling unit to divide the detected image into the balanced codeword detecting areas and sampling data of the balanced codeword detecting areas by using the determined distribution pattern and an optical distribution characteristic of the balanced codewords.

16. A data sampling method for sampling data from a detected image of a data page which is coded with balanced codewords and is detected by the use of 1:N over-sampling wherein, N is 1.33 or 1.5 and excessive detection pixels are arranged at a ratio of N×N detection pixels per 1×1 data pixel of the data page, the data sampling method comprising:
   calculating, at an optical detection unit coupled to a processor, a light intensity distribution of the detected image to detect a frame mark detecting area corresponding to a frame mark of the data page and determining, at the processor, a distribution pattern of valid detection pixels and invalid detection pixels by the use of an optical distribution of the detected frame mark detecting area, wherein the optical detection unit comprises a plurality of detection pixels for detecting optical information by using the 1:N excessive detection pixels, and each detection pixel detects the optical information using a detection region having one of the horizontal width or the vertical width smaller by a half than the vertical width or the horizontal width of each of the corresponding excessive detection pixel, wherein the detection region is configured to detect the image and the detection region and the corresponding detection pixel are made of pixel sensors comprising one of complementary metal-oxide semiconductor (CMOS) pixels or charge-coupled device (CCD) pixels, and wherein the detection region locates at an upper, a center, or a lower portion of each of the corresponding detection pixel; and
   dividing the detected image into balanced codeword detecting areas corresponding to the balanced codewords and sampling data of the balanced codeword detecting areas by using the determined distribution pattern and an optical distribution characteristic of the balanced codeword.

17. A data sampling method for sampling data from a detected image of a data page which is coded with balanced codewords and is detected by the use of 1:N over-sampling wherein, N is 1.33 or 1.5 and excessive detection pixels are arranged at a ratio of N×N detection pixels per 1×1 data pixel of the data page, the data sampling method comprising:
   dividing, by an optical detection unit coupled to a processor, the detected image into balanced codeword detecting areas corresponding to the balanced codewords and classifying, by the processor, the detection pixels in the balanced codeword detecting areas into valid detection pixels and invalid detection pixels based on the light intensity distribution of the detected image, wherein the optical detection unit comprises a plurality of detection pixels for detecting optical information by using the 1:N excessive detection pixels, and each detection pixel detects the optical information using a detection region having one of the horizontal width or the vertical width smaller by a half than the vertical width or the horizontal width of each of the corresponding excessive detection pixel, wherein the detection region is configured to detect the image and the detection region and the corresponding excessive detection pixel are made of pixel sensors comprising one of complementary metal-oxide semiconductor (CMOS) pixels or charge-coupled device (CCD) pixels, and wherein the detection region locates at an upper, a center, or a lower portion of each of the corresponding detection pixel;

determining, by the processor, the optical information of the valid detection pixels by the use of the optical distribution characteristic of the balanced codewords to detect data of data pixel detected by the valid detection pixels; and calculating, at the processor, the values of the data pixels and the optical information of the invalid detection pixels to detect data of data pixels detected by the invalid detection pixels.

18. The data sampling method according to claim 17, wherein the detecting of the values of the data pixels detected by the valid detection pixels comprises:

causing determination at least one valid detection pixel having the largest light intensity among the valid detection pixels having the ON value and causing determination at least one valid detection pixel having the smallest light intensity having the OFF value; and causing determination of values of the other valid detection pixels in the balanced codeword detection area by using the light intensities of the valid detection pixels determined to have the ON or OFF value.

* * * * *